United States Patent [19]
Miller

[11] Patent Number: 4,605,906
[45] Date of Patent: Aug. 12, 1986

[54] DIFFERENTIAL PAIR AMPLIFIER ENHANCEMENT CIRCUIT

[75] Inventor: Allen Miller, London, England

[73] Assignee: Gould Instruments, Ltd., Essex, England

[21] Appl. No.: 695,668

[22] Filed: Jan. 28, 1985

[51] Int. Cl.$^4$ .......................... H03F 3/45; H03F 1/32
[52] U.S. Cl. .................................. 330/149; 330/252; 330/256; 330/311
[58] Field of Search ................ 330/149, 252, 256, 311

[56] References Cited

U.S. PATENT DOCUMENTS 3,450,998  6/1969  Greefkes et al. ............... 330/311 X
3,852,688  12/1974  Takeda ........................... 330/252 X Primary Examiner—James B. Mullins
Attorney, Agent, or Firm—Jeannette M. Walder; G. Paul Edgell; Edward E. Sachs

[57] ABSTRACT

An enhanced differential pair amplifier circuit 28, 30 is described which provides a linearity correction technique. The linearity correction technique is designed to compensate for nonlinearities in the base-to-emitter output voltage of each transistor in a differential pair of transistors over the dynamic input range of the amplifier. The present invention comprises the inclusion of compensation diodes or transistors 42, 44 in the load circuit of each input transistor in the differential pair to compensate for nonlinearities.

11 Claims, 5 Drawing Figures

DIFFERENTIAL PAIR AMPLIFIER ENHANCEMENT CIRCUIT

BACKGROUND OF THE INVENTION

The invention relates generally to amplifiers operable over a wideband signal range, and more specifically relates to nonlinearity correction techniques for differential-pair amplifiers.

Many applications require amplifiers which are capable of operating over a wideband range of signals. For instance, digital storage oscilloscopes require amplifiers that are capable of receiving and amplifying signals over a very large range of voltage levels. A frequently used amplifier in such applications is the differential-pair amplifier or its cascode-connected configuration. In circuits which need to operate over large input signal swings, a significant standing current is normally required to reduce the effect of base-emitter voltage variations in the transistor of the amplifier over the dynamic range of the device. The problem becomes severe when low-value emitter-degeneration resistors are used since power requirements can become excessive. A further difficulty arises in trying to optimally match the static power of the transistors in the differential pair with that of the load to provide minimum power change when the stage is driven.

One well-known method of reducing amplifier distortion is through the use of feedback techniques. In feedback amplifiers, the final output is sensed and fed back into the input so that linearity errors and thermal distortions are cancelled to a large degree. While feedback amplifiers having high precision may be designed, their use tends to be more restricted to lower frequencies. This is because at high frequency, phase shift within the amplifier tends to impair the stability when the feedback loop is closed. To preserve a stable phase margin, it is often necessary to reduce the open loop gain, thus causing deterioration of the overall performance.

If nonlinearities are attempted to be corrected by optimally matching the static power of the transistors in the differential pair with that of the loads to provide minimum power change when the stages are driven, this optimum setting often results in a low static operating voltage existing across the transistors. This low static operating voltage can cause $f_T$ degeneration, particularly when large collector currents are required in the differential pair. The $f_T$ parameter is a commonly used parameter in transistors, being a measurement of the frequency at which the common emitter current gain becomes unity. This is due to an inverse dependence of the effect of the base width with collector emitter voltage. Thus, the combination of the need to use large collector currents in a differential pair amplifier on a low static operating collector emitter voltage often results in degeneration of $f_T$ from the optimum.

When the cascode configuration is employed, it is not always possible to accurately thermally balance the differential pair. U.S. Pat. No. Re. 31,545 describes a feed-forward technique for first order correction of amplifier distortion through the use of a correction amplifier which is connected to the main amplifier to sense base-to-emitter distortion and develop an error signal which is injected to an output node to provide cancellation of distortion from the output of the main amplifier. FIG. 3(a) of U.S. Pat. No. Re. 31,545 ilustrates how the input is monitored. A certain change in the input signal causes a certain nonlinearity $\Delta V_{be}$ that is monitored by transistors 100, 102 and emitter-degeneration resistor 105. This causes an equal and opposite compensatory input such that the sum of the compensatory input and the normal input are added at the output current at resistors R88 to minimize nonlinearities. It is important to note that using the approach described in the reissue patent, high-frequency performance is minimized because it requires that transistors 100 and 102 have characteristics that are the same or better than transistors 70 and 72.

An additional problem with the technique described in U.S. Pat. No. Re. 31,545 is that it provides only first-order cancellation of nonlinearities. In some circumstances, it is necessary to provide a more precise form of correction of nonlinearities.

SUMMARY OF THE INVENTION

It is an object of the subject invention to provide a linearity correction technique for a differential-pair amplifier.

It is an object of the subject invention to provide a means of linearity compensation for integral gain stages.

It is a further object of the subject invention to provide a linearity compensation technique in the load side of an enhanced differential pair amplifier.

It is another object of the present invention to provide a relatively simple linearity correction technique requiring minimal electronic components.

These and other objects, advantages, and features of the present invention will become apparent from the following description taken in conjunction with the drawings.

The invention can be described as an enhanced differential pair amplifier circuit which includes first and second common lines having different electrical potential in first and second input transistors in which the input transistor has a base, emitter, and collector, and at least one of the bases is provided to receive a voltage input signal. The amplifier also includes first and second current sources in which the first current source is connected to the emitter of the first input transistor and common line, and the second current source is connected between the emitter of the second input transistor in the first common line. The amplifier also includes a gain-defining emitter degeneration transistor resistor connected between the emitters of the first and second resistors. First and second diode means are also provided for linearity compensation. Each diode means has a first and second end. The first end of the first diode means is connected to the collector of the first input transistor, and the first end of the second diode means is connected to the collector of the second input transistor. The second ends of the first and second diode means are connected to the second common lines such that the diode means are forward biased. The amplifier also includes an output signal means for providing an output signal from the collectors of the first and second input transistors.

DETAILED DESCRIPTION OF THE PREFERRED EMBODIMENT

Figure 1:
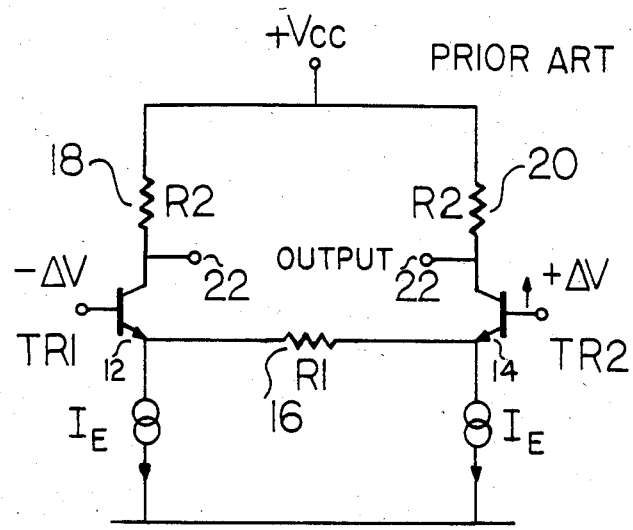
FIG. 1 illustrates a traditional differential pair amplifier.

Refer now to FIG. 1 which is a typical traditional differential pair amplifier. In this figure, transistors 12 and 14 are connected to resistor 16 through the emitters of the transistors 12 and 14. When a voltage is applied to the base of each transistor, the voltage is superimposed across the resistor 16 thus creating a current through the resistor. This current then flows through load resistors 18, 20 to produce a voltage at the output 22.

When applying a voltage to the base of the input transistors 12 and 14, the base-to-emitter voltage drop of transistors 12 and 14 changes such that the summation of the two voltage drops are not the same as before applying the voltage. Thus, the voltage across resistor 16 does not directly follow the input voltage to the differential pair. This in turn causes the output voltage at 22 to be inconsistent with the input voltage. Thus a need exists to correct the inconsistency between input and output voltage.

Figure 2:
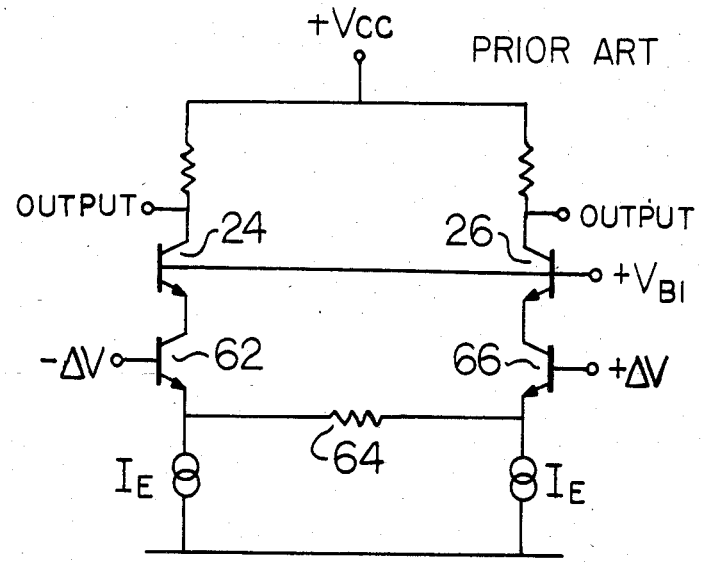
FIG. 2 illustrates a traditional differential pair amplifier having cascode connections.

A similar problem exists with the circuit illustrated in FIG. 2 which is simply a differential pair with cascode connections 24, 26. The present invention comprehends that inconsistencies in either circuit illustrated in FIGS. 1 and 2 can be corrected using the techniques described below.

Figure 3:
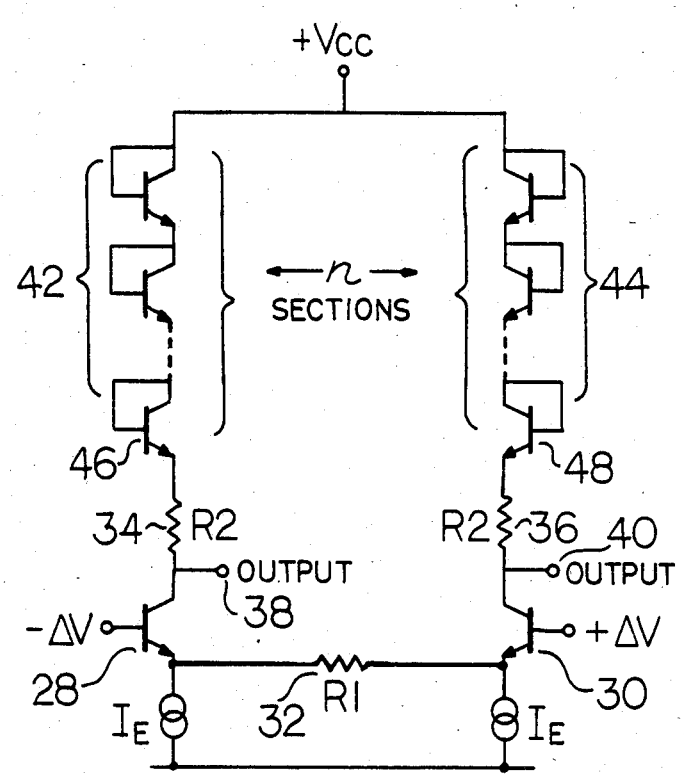
FIG. 3 illustrates one embodiment of the subject invention for a gain of n.

Refer now to FIG. 3 which illustrates one embodiment of the subject invention. As can be seen from the figure, a differential pair 28, 30 is connected to resistor 32 in an idential fashion as illustrated in FIG. 1. Thus, when a voltage is applied to differential pair 28 and 30 to induce a current in load resistors 34 and 36, the resulting output voltage at 38 and 40 would normally be inconsistent with the input voltage. However, as can be seen in the figure, a plurality of transistors 42 and 44 are provided. It should be noted that these transistors can be replaced with forward-biased diodes. In the embodiment illustrated in FIG. 3, each of the transistors 42 and 44 are acting as diodes because the base of each transistor is connected to its respective collector.

It will be recalled from the previous discussion of FIG. 1 that variations in voltage applied to the differential pair will cause the summation of the two base/emitter voltage drops to not be constant. This is due to associated change in currents through the two transistors. The present invention capitalizes on the associated changes in current through load resistors 34 and 36 by using these changes in current to manifest themselves as diode loads in compensating transistors 42 and 44 which are connected in series with the compensating transistors.

The compensating transistors 42 and 44 are chosen such that the diode drop across each side of the compensating network precisely mirrors the voltage drop which occurs across each side of the differential pair during operation. Thus, the summation of the voltage drop across each side of the compensating network precisely mirrors the unequal changes which are occurring in the summation of voltages across the differential pair transistors.

For a gain of one, the subject invention simply requires that a single compensating transistor 46 and 48 be provided for each transistors in the differential pair. Compensation transistors 46 and 48 have idential characteristics as different pair transistors 28 and 30. Thus, the effect of compensating transistors 46 and 48 is equal and opposite to the undesirable effects of differential pair transistors 28 and 30. In the preferred embodiment, the compensating transistors act as a diode means in which the transistors or diodes have substantially identical current versus voltage characteristics as the base-to-emitter voltage characteristics of the input transistors 28 and 40 to provide compensation for nonlinearities when the gain of the amplifier is an integral number.

For a gain of more than one, if the gain is to be an integral gain, the present invention requires simply that a corresponding number of pairs of compensating transistors be added. Thus, for a gain of three for instance, three pairs of compensating transistors would be required. Each compensating transistor in the pair would be idential in characteristics to each of the differential-pair transistors.

Figure 4:
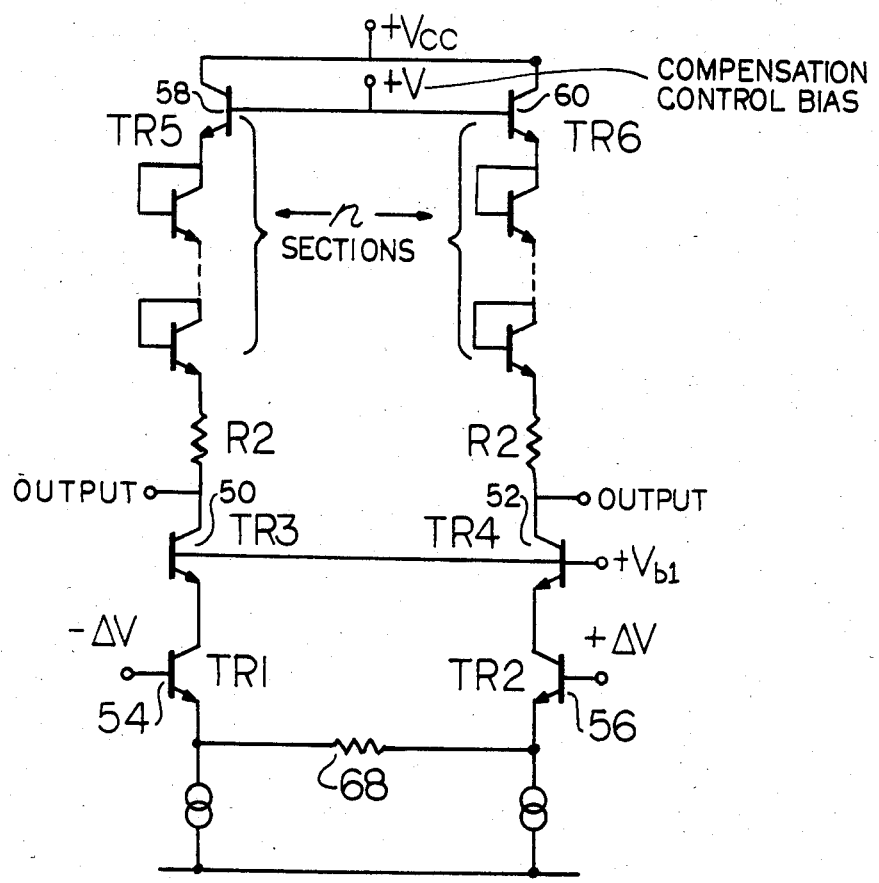
FIG. 4 illustrates another embodiment of the subject invention for a gain of n where cascode connections are employed.

Refer now to FIG. 4 which illustrates another embodiment of the subject invention in which a cascode connection exists. Cascode connections are well-known in the art for high-frequency uses. The addition of a cascode connection 50, 52 as illustrated in FIG. 4 has no effect on the compensation network. Thus, for a gain of one, a single compensation pair is required. However, it should be noted that the use of the cascode pair has some effect yielding change in transients due to thermal conditions in the differential pair transistors 54 and 56. These changes in transients are compensated through base-connected transistors 58 and 60. Referring to FIG. 1, it is normally a requirement for the circuit designer to match the static power in each transistor 12 or 14 with its associated load 18 or 20 and the contribution from the emitter resistor 16. By achieving this matching, the power in the transistors 12 and 14 do not vary under signal conditions, and hence no thermal distortion results. If there is a power mismatch, however, a signal change causes a corresponding power change in each transistor of the pair resulting in a change in the base emitter voltage of each transistor as it heats/cools (this is usually about −2 mV/°C. for silicon), and hence produces a distortion signal. Referring now to FIG. 2, the cascode circuit; it is now necessary only to match the power in 62 with the contribution from the emitter resistor 64 since no collector load for 62 or 66 exists, this is not taken into account as was the case for FIG. 1.

As an example, to give some practical numbers, if $I_E = 10$ mA where $I_E$ is the current through the emitter of transistor 62, and $R_{64} = 100$ where $R_{64}$ is the value of the resistance of resistor 64, then the voltage collector emitter voltage VCE of the transistor 62 to achieve this result is determined by the following:

$$VCE I_E = I_E^2 (R_1/2)$$

giving VCE = 0.5 V.

In order to operate with satisfactory high-frequency performance, a transistor would need its VCE to be greater than about 2 V, hence a conflict of requirements exists. The situation becomes severe for a cascode because it has no load in the collectors which, if present, would act to increase the 0.5 V calculated.

Referring now to FIG. 4, the transistors 54 and 56 are biased to a sufficient voltage for reasonable high-frequency performance. There is now a power change in these transistors under signal conditions causing a thermal distortion. Considering first a gain of 1 so that only transistors 58 and 60 are included in the network used for compensation (i.e., no diode-connected transistors).

Approximately, the power error in the differential pair transistors, 54 or 56 is given by $$\text{Power error} = VCE(I_E) - (I_E{}^2)(R_{68}/2)$$

and this power error is deliberately induced in compensation transistors 58, 60 to match that generated in 54 and 56 and so compensate out the error in a similar manner to that used to correct gain error.

Considering transistors 58, 54

$$\text{then Power error} = (I_E)VCE_{58} = VCE_{54}(I_E) - I_E{}^2(R_{68}/2)$$

(cancelling the $I_E$ term)

$$VCE_{58} = VCE_{54} - I_E(R_{68}/2)$$

where $VCE_{58}$ is the required sustaining voltage that must be set across transistor 58 (or 60) by setting up the V compensation control bias.

For cases where the gain of the circuit is greater than unity, the power error term is multiplied by the circuit gain, n. The compensation voltage then includes the voltage across the transistors 58, 60 plus that dropped across the n diodes each half of the circuit.

i.e. Power
$$\text{error} = I_E[VCE_{58} + (n-1)Vbe] = nI_E[VCE_{54} - I_E(R_1/2)]$$

where Vbe is the forward voltage of each diode in the chain.

The main advantage with this circuit is that now, the designer does not have to worry unduly about reducing the voltage across the differential pair transistors to balance power, but can concentrate instead to optimizing the voltage to obtain the best bandwidth. One fundamental consideration with this circuit, however, is that the rate of temperature change (thermal time constant) in transistor 54 must be the same as that in compensation component 58. This would normally be the case anyway in an integrated circuit.

Figure 5:
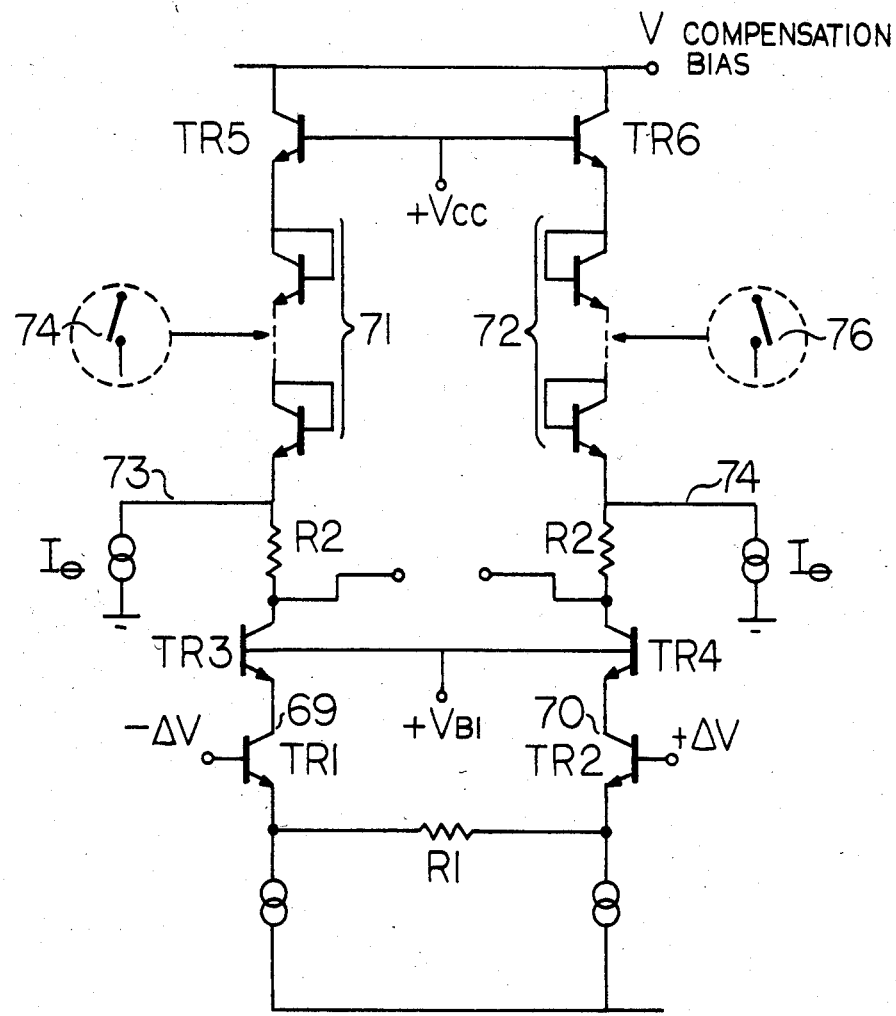
FIG. 5 illustrates yet another embodiment of the subject invention for nonintegral gains.

In instances in which it is desired to provide a nonintegral gain, it is necessary to use the embodiment of the invention illustrated in FIG. 5. As can be seen in the figure, a differential pair 69, 70 and compensation transistors 71, 72 are provided in a similar manner as discussed above. However, in addition to the components previously used for compensation, a pair of current sources 73, 74 are provided which adjust the nonlinear characteristics of the diode loads across the compensation transistors 71 and 72. This adjustment of nonlinear characteristics allows the use of nonintegral gain values. This can best be described by the following equation.

$$r_e = (dV_{BE}/dI_E) = (kT/eI_E) \quad \text{Equation 1}$$

Where
  $r_e$ is the incremental diode resistance, dependent on current;
  k is Boltzman's constant = $1.38 \times 10^{-23}$ Joule/°K.;
  T is temperature in °K.;
  e is electronic charge = $1.6 \times 10^{-19}$ coulomb; and
  $I_E$ is the transistor (diode) emitter current.

By adjustment of current sources 73 and 74, $I_c$ in the diode loads 71 and 72 are concurrently adjusted. This adjustment provides a different portion of the logarithmic curve of the base/emitter diodes of 71 and 72. The ratio of diode curves of the load transistors 71 and 72 with respect to base emitter diodes of 69 and 70 is determined by current sources 73 and 74. By thus providing a different portion of the curve, nonintegral gain valves may be compensated.

It should be noted that in one embodiment of the subject invention, a switch means is provided for connecting and disconnecting a plurality of compensation transistors such that the switch means connects "X" transistors to the input transistors wherein X divided by the number of input transistors used in the differential pair equals the gain of the amplifier. In other words, a switch may be provided to connect three pairs of compensating transistors when the amplifier is operating at a gain of three and connect one pair of compensation transistors when the amplifier is operating at a gain of one. This switch means is illustrated in phantom by elements 74 and 76 of FIG. 5.

This invention can be described in mathematical terms. This description is provided below.

MATHEMATICAL BACKGROUND TO THE PRINCIPLE OF OPERATION

A. The process causing the distortion due to VBE

The well known diode law relationship, $I = I_o exp(qV/kT) - 1]$ may be differentiated to form the following entity:

$$(dI/dV) = (q/kT)I_o exp(qV/kT) \quad \text{Equation 2}$$

thus, by substituting for $I_o exp(qV/kT)$ we have $$dI/dV = qI/kT \text{ or } dV/dI = kT/qI \quad \text{Equation 3}$$

Now if dV/dI is related to the transistor base emitter voltage, VBE and q is equated to the electron charge, e, then $$dVBE/dI_E = kT/eI_E \quad \text{Equation 4}$$

at room temperature, T = 300° K., e = $1.6 \times 10^{-19}$ coulomb and Boltzman's constant, k = $1.38 \times 10^{-23}$ Joule/°K., the quantity $$kT/e = 25.87 \times 10^{-3}$$

hence, $dVBE/dI_E$ behaves as a resistance, r e, whose value is related to emitter current $I_E$.

The total impedance, R, seen at the emitter of any transistor can be expressed as $$R = re + RE + (Rs + Rbb'/1 + \beta) \quad \text{Equation 5}$$

where
  $R_E$ = a bulk impedance of the emitter connection;
  Rbb' = the base spreading resistance;
  Rs = the input source resistance; and
  $\beta$ = the transistor dc current gain.

Initially for the simple approach, if $\beta$ variation as a function of emitter current is ignored, then the quantity $RE + (Rs + Rbb'/1 + \beta)$ could be equated to a fixed resistance $R\alpha$.

Thus for the differential state shown in FIG. 1 the total emitter degeneration resistance is equal to $(R1 + 2R\alpha + 2re) = R1'$, say where $$re = (kT/e)(1/I_E).$$ Equation 6

If a signal $-\Delta V$ is applied to TR1 and $+\Delta V$ to TR2 this produces a current change in R1, where $$\Delta I = \frac{2\Delta V}{R1 + 2R_\alpha + re_1 + re_2} = \frac{2\Delta V}{R1'}, \text{ say,}$$ Equation 7 thus the r e for transistor TR1, $$re_1 = \frac{kT}{e}\left(\frac{1}{I_E - \frac{2\Delta V}{R1'}}\right)$$ Equation 8 and, for TR2

$$re_2 = \frac{kT}{e}\left(\frac{1}{I_E + \frac{2\Delta V}{R1'}}\right)$$ Equation 9

$$R1' = R1 + 2R\alpha + \frac{2kT}{e}\left(\frac{I_E}{I_E^2 - \frac{4\Delta V^2}{(R1')^2}}\right)$$ Equation 10

Thus, the distortion term is given by $4\Delta V^2/(R1')^2$, where the gain varies with the applied input voltage.

B. The correction technique used to reduce the distortion

The state shown in FIG. 3 is arranged to make R1 and R2 related by an integer, $\eta$, where $R2 = \eta R1/2$ and, accordingly, $\eta$ diode-connected transistors are placed in series with each collector load.

Assuming a high $\beta$ in each transistor, the collector current $Ic \simeq I_E$ will give an effective load impedance for side 1

$$\simeq \frac{\eta R1}{2} + nR\alpha + \frac{2nkT}{e}\left(\frac{1}{I_E - \frac{2\Delta V}{R1'}}\right)$$ Equation 11 and for side 2

$$\simeq \frac{nR1}{2} + nR\alpha + \frac{2nkT}{e}\cdot\left(\frac{1}{I_E + \frac{2\Delta V}{R1'}}\right)$$ Equation 12

Thus the total gain, G, is given by $$G = \frac{nR1 + 2nR\alpha + \frac{2nkT}{e}\cdot\left(\frac{I_E}{I_E^2 - \frac{4\Delta V^2}{(R1')^2}}\right)}{R1 + 2R\alpha + \frac{2kT}{e}\left(\frac{I_E}{I_E^2 - \frac{4\Delta V^2}{(R1')^2}}\right)}$$

Thus the numerator and denominator terms cancel to give gain $G = n$, which is independent of $\Delta V$.

Although the invention has been described and illustrated in detail, it is to be clearly understood that the same is by way of illustration and example only, and is not to be taken by way of limitation; the spirit and scope of this invention being limited only by the terms of the appended claims.

I claim:

1. An enhanced differential pair amplifier circuit comprising:
   first and second common lines, said first common line being at a different potential than said second common line;
   first and second input transistors, each input transistor having a base, emitter, and collector, at least one of said bases being provided to receive a voltage input signal;
   first and second current sources, said first current source connected between the emitter of said first input transistor and first common line, said second current source being connected between the emitter of said second transistor and first common line;
   a gain-defining emitter degeneration transistor resistor connected between the emitters of said first and second transistors;
   first and second diode means for linearity compensation, each diode means having first and second ends, said first end of said first diode means being connected to the collector of said first input transistor and said first end of said second diode means being connected to the collector of said second input transistor, said second ends of said first and second diode means being connected to said second common line such that said diode means are forward biased;
   wherein each of said diode means comprises n diodes, where n is the integral gain of the amplifier; and
   output signal means for taking an output signal from the collectors of said first and second input transistors.

2. An enhanced differential pair amplifier circuit as recited in claim 1, wherein:
   said first end of said diode means is the cathode side of said diode means, and said second end of said diode means is the anode side of the said diode so that the diode means is forward biased during operation of the amplifier.

3. An enhanced differential pair amplifier circuit as recited in claim 1 wherein each of said diode means comprises n compensation transistors, where n is the integral gain of the amplifier, and where each compensation transistor acts as a diode.

4. An enhanced differential pair amplifier as recited in claim 3, further comprising:
   thermal compensation means for correcting for thermally induced nonlinearities in the output with respect to the input of said amplifier.

5. An enhanced differential pair amplifier circuit as recited in claim 4, said circuit being connected in cascode configuration, wherein said thermal compensation means comprises:
   first and second thermal compensation transistors, each thermal compensation transistor having first and second ends, said first end of said first thermal compensation transistor being connected to the second end of said first diode means, said first end of said second thermal compensation transistor being connected to the second end of said second diode means, said second ends of said first and second thermal compensation transistors being connected to said second common line; and a voltage source connected between the bases of said first and second thermal compensating transistors to provide a voltage across said first and second thermal compensating transistors approximately equal to the voltage across said first and second diode means multiplied by the gain of said amplifier to provide a multiplied thermal characteristic at the output to correct for thermal characteristics of said first and second diode means.

6. An enhanced differential pair amplifier circuit as recited in claim 3, wherein:

said input and compensation transistors have identical base-to-emitter current versus voltage characteristics.

7. An enhanced differential pair amplifier circuit as recited in claim 1, wherein:

said diode means have substantially identical current versus voltage characteristics as the base-to-emitter voltage characteristics of said input transistors.

8. An enhanced differential pair amplifier circuit as recited in claim 1, further including:

first and second load resistors, said first load resistor being connected in series with said first diode means, and said second load resistor being connected in series with said second diode means.

9. An enhanced differential pair amplifier as recited in claim 1, further including:

switch means for connecting and disconnecting said plurality of diodes in said first and second diode means, said switch means connecting "X" diodes to said first and second input transistors such that X divided by the number of said input transistors used in said differential amplifier circuit equals the gain of said amplifier.

10. An enhanced differential pair amplifier circuit comprising:

first and second common lines, said first common line being at a differential potential than said second common line;

first and second input transistors, each input transistor having a base, emitter, and collector, at least one of said bases being provided to receive a voltage input signal;

first and second current sources, said first current source connected between the emitter of said first input transistor and first common line, said second current source being connected between the emitter of said second input transistor and first common line;

a gain defining emitter degeneration transistor resistor connected between the emitters of said first and second transistors;

first and second diode means for linearity compensation, each diode means having first and second ends, said first end of said first diode means being connected to the collector of said first input transistor and said first end of said second diode means being connected to the collector of said second input transistor, said second ends of said first and second diode means being connected to said second common line such that said diode means are forward biased;

noninteger compensation means for compensating for nonlinearities of said output signal with respect to said input signal caused by imbalances in the base-to-emitter characteristics of said differential pair when the gain of said amplifier is a noninteger; and output signal means for taking an output signal from the collectors of said first and second input transistors.

11. An enhanced differential pair amplifier as recited in claim 10, wherein said noninteger compensation means further includes:

third and fourth current sources, said third current source being connected to said amplifier between said first input transistor and said first diode means, said fourth current source being connected to said amplifier between said second input transistor and said second diode means.

* * * * *